(12) United States Patent
Quaal et al.

(10) Patent No.: US 9,080,745 B2
(45) Date of Patent: Jul. 14, 2015

(54) ANGLED EMITTER CHANNEL LETTER LIGHTING

(75) Inventors: Bruce Quaal, Ventura, CA (US); Drew Ferrie, Ojai, CA (US); Aaron Meyer, Ventura, CA (US)

(73) Assignee: THE SLOAN COMPANY, INC., Ventura, CA (US)

( * ) Notice: Subject to any disclaimer, the term of this patent is extended or adjusted under 35 U.S.C. 154(b) by 1212 days.

(21) Appl. No.: 13/010,703

(22) Filed: Jan. 20, 2011

(65) Prior Publication Data

US 2011/0209368 A1    Sep. 1, 2011

Related U.S. Application Data

(63) Continuation-in-part of application No. 13/010,413, filed on Jan. 20, 2011, now abandoned, and a continuation-in-part of application No. 12/316,411, filed on Dec. 12, 2008, now abandoned.

(60) Provisional application No. 61/297,681, filed on Jan. 22, 2010, provisional application No. 61/425,713, filed on Dec. 21, 2010.

(51) Int. Cl.
  *F21V 19/00* (2006.01)
  *F21S 4/00* (2006.01)
  (Continued)

(52) U.S. Cl.
  CPC ............... *F21V 19/003* (2013.01); *F21S 4/003* (2013.01); *F21V 15/01* (2013.01); *F21V 19/001* (2013.01); *F21V 21/0808* (2013.01); *F21V 23/005* (2013.01); *F21V 31/04* (2013.01);
  (Continued)

(58) Field of Classification Search
  USPC .............. 362/249.02, 249.11, 800, 219, 222, 362/223, 225, 228, 240
  See application file for complete search history.

(56) References Cited

U.S. PATENT DOCUMENTS 5,697,175 A    12/1997  Schwartz
6,042,248 A     3/2000  Hannah et al.
(Continued)

FOREIGN PATENT DOCUMENTS

CN    101178164    5/2008
FR      2908500    5/2008

OTHER PUBLICATIONS

GE Lighting Solutions, Tetra® Powerstrip and Powerstrip DS. technical data sheet and installation guide, 4 pages each, 2011.
(Continued)

*Primary Examiner* — Laura Tso
(74) *Attorney, Agent, or Firm* — Koppel, Patrick, Heybl & Philpott

(57) ABSTRACT

The present embodiments provide channel letter lighting devices and/or systems. A lighting system, comprising a plurality of electrically connected lighting units, comprising conductors to provide an electrical signal to each of the units. Each of the lighting units comprise a housing, a printed circuit board (PCB) mounted within the housing and having a plurality of tabs and a plurality light emitting elements on the tabs. The tabs are angled in relation of the remainder of the PCB or housing. The electrical signal applied to the light emitting elements causes them to emit light substantially away from said housing. The lighting system further comprises a sealant within the housing filling cavities around the light emitting elements and the cavity around said PCB and a mounting mechanism for mounting the unit to a structure.

82 Claims, 4 Drawing Sheets

(51) Int. Cl.

| | | |
|---|---|---|
| *F21V 15/01* | (2006.01) | |
| *F21V 21/08* | (2006.01) | |
| *F21V 23/00* | (2015.01) | |
| *F21V 31/04* | (2006.01) | |
| *G09F 13/04* | (2006.01) | |
| *G09F 13/22* | (2006.01) | |
| *H05K 1/02* | (2006.01) | |
| *F21V 29/00* | (2015.01) | |
| *F21Y 101/02* | (2006.01) | |
| *H05K 1/18* | (2006.01) | |
| *H05K 1/05* | (2006.01) | |

(52) U.S. Cl.
CPC ............ *G09F13/0404* (2013.01); *G09F 13/22* (2013.01); *H05K 1/0278* (2013.01); *F21V 29/004* (2013.01); *F21Y 2101/02* (2013.01); *G09F 2013/222* (2013.01); *H05K 1/05* (2013.01); *H05K 1/189* (2013.01); *H05K 2201/046* (2013.01); *H05K 2201/09081* (2013.01); *H05K 2201/10106* (2013.01); *Y10T 29/49165* (2015.01); *Y10T 29/49993* (2015.01)

(56) References Cited

U.S. PATENT DOCUMENTS

| | | |
|---|---|---|
| 6,283,612 B1 | 9/2001 | Hunter |
| 6,394,626 B1 | 5/2002 | McColloch |
| 6,932,495 B2 | 8/2005 | Sloan et al. |
| 7,063,440 B2 | 6/2006 | Mohacsi et al. |
| 7,165,863 B1 * | 1/2007 | Thomas et al. ............... 362/219 |
| 7,241,031 B2 | 7/2007 | Sloan et al. |
| 7,245,279 B2 * | 7/2007 | Wang ............................. 345/84 |
| 7,926,976 B2 | 4/2011 | Schinzel-Kolb et al. |
| 2005/0231943 A1 | 10/2005 | Sloan et al. |
| 2008/0310156 A1 | 12/2008 | Wang |
| 2009/0226656 A1 | 9/2009 | Crandell et al. |
| 2010/0124060 A1 * | 5/2010 | Wang ....................... 362/249.06 |
| 2010/0135024 A1 | 6/2010 | Gier et al. |
| 2010/0157595 A1 * | 6/2010 | Lin et al. ....................... 362/235 |

OTHER PUBLICATIONS

US LED. Tandum2 brochure and specification. 11 pages.
LumiLEDs, Inc. Red Super Flux LED Rail, data sheet. HLCR-KR99-R0100, HLCR-KR99-R0200, pp. 1-4.
"Turnkey Plastic Injection Molding Services. Overmolding", Kamek Precision Tools. Inc.. pp. 1-5. http://www.kamek.com/Overmolding/Default.aspx, 2008.
Tetra(tm) Mini Brings Bright Light to Small Signage Applications. GE Consumer Products, Aug. 18, 2010, pp. 1-4, http://pressroom.geconsumerproducts.com/pr/ge/06_tetramini.aspx.
Response to Office Action from corresponding U.S. Appl. No. 12/316,411, dated May 16, 2012.
Office Action from corresponding U.S. Appl. No. 12/316,411, dated Feb. 17, 2012.
Response to Office Action from corresponding U.S. Appl. No. 12/316,411. dated Dec. 19, 2011.
Office Action from corresponding Patent Appl. No. 12/316.411, dated Sep. 19, 2011.
Response to Office Action from corresponding U.S. Appl. No. 12/316,411, dated Sep. 6, 2011.
Office Action from corresponding U.S. Appl. No. 12/316,411, dated Aug. 8, 2011.
Second Office Action from Chinese Appl No. 201180011641.1, dated Dec. 31. 2014.
"US LED: Tandem Cabinet Lighting, Tandem, Overview" <http://www.usled.com/web10/products/cabinet/tandem/tandem.htm>, Apr. 28, 2011
First Office Action from corresponding Chinese Appl. No. 201180011641.1, dated Apr. 23, 2014.

* cited by examiner

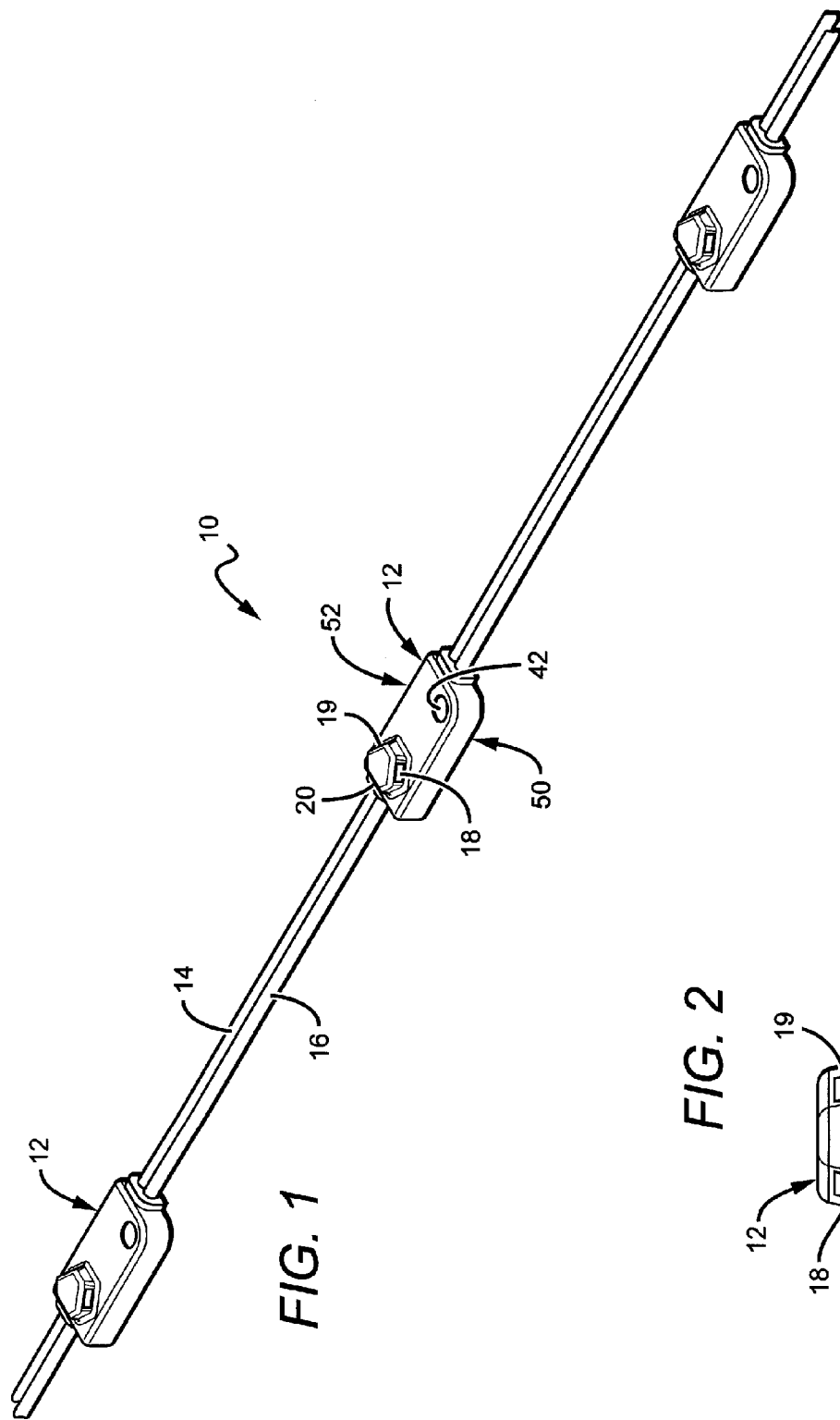

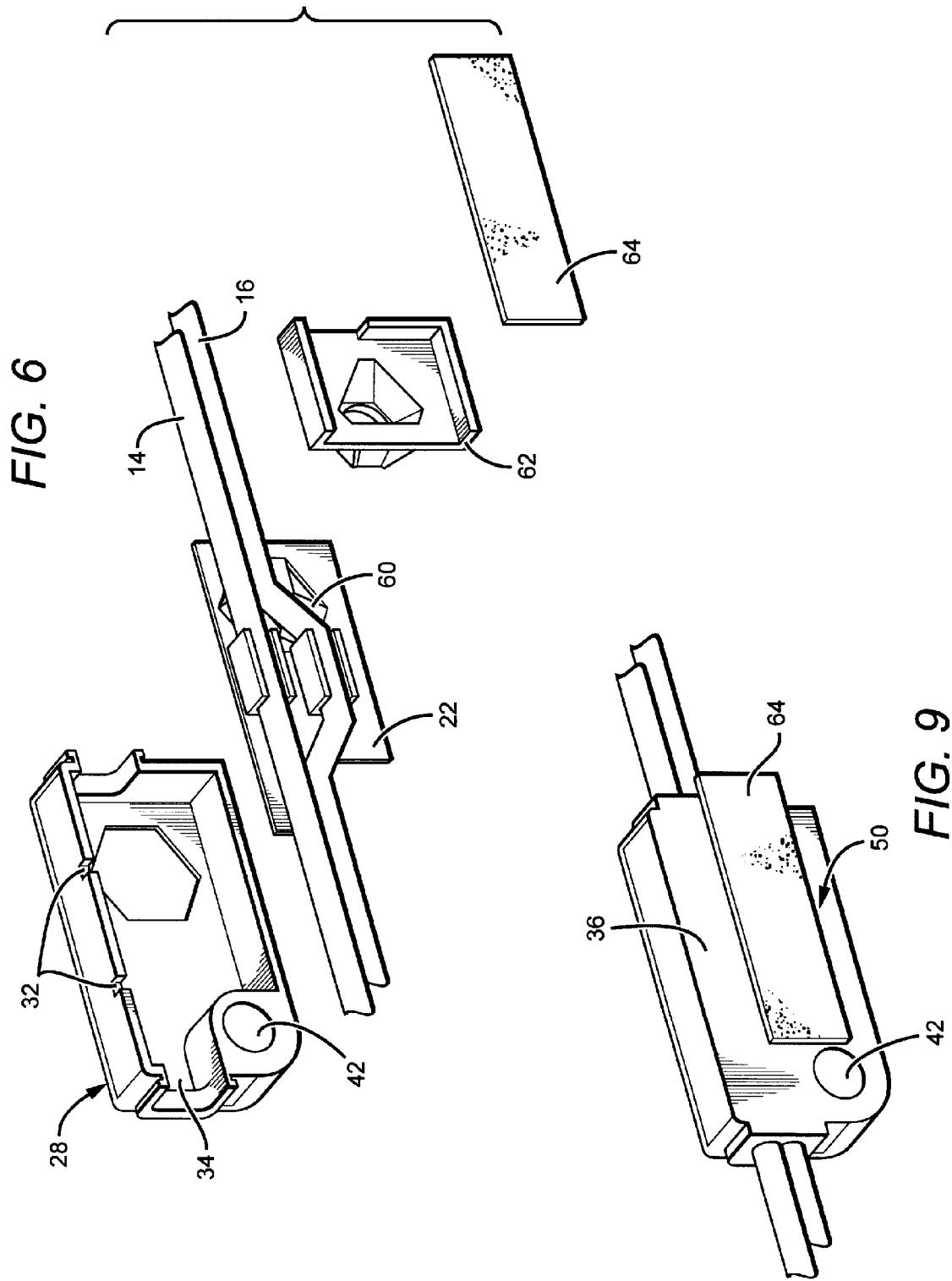

ANGLED EMITTER CHANNEL LETTER LIGHTING

This application is a continuation in part of Ser. No. 13/010,413 to Bruce Quaal et al., filed on Jan. 20, 2011, now abandoned also a continuation in part of Ser. No. 12/316,411 to Thomas C. Sloan, which was filed on Dec. 12, 2008, now abandoned and also claims the benefit of provisional application Ser. No. 61/297,681 to Drew Ferrie filed on Jan. 22, 2010 and provisional application Ser. No. 61/425,713 to Drew Ferrie, which was filed on Dec. 21, 2010. The contents of Ser. Nos. 12/316,411, 13/010,413, 61/425,713 and 61/297,681 are incorporated entirely herein by reference.

BACKGROUND OF THE INVENTION

1. Field of the Invention

This invention relates to lighting units using angled lighting for illuminating channel letters and more particularly to LED based lighting units for illuminating channel letters with angled or side emitting LEDs.

2. Description of the Related Art

Recent developments in LEDs have resulted in devices that are brighter, more efficient and more reliable. LEDs are rugged, consume less power, have a relatively long life (up to 100,000 hours), operate at low voltage, and are 30 to 70% more energy efficient than conventional lights, such as incandescent, neon or fluorescent bulbs. As a result of these developments, LEDs are becoming utilized in many more lighting applications that were previously the realm of incandescent, neon or fluorescent light sources.

Channel letters are commonly found on the outside of buildings and are often used to advertise the name of the business. They are typically constructed of aluminum or plastic housing having the shape of a letter and are approximately 2" to 5" deep. The housing has a generally U-shaped cross-section, with the top opening in the housing covered by a colored translucent lens that transmits light from within the housing.

Channel letters are typically illuminated with neon or fluorescent light sources that are mounted within the channel letter housing. Neon and fluorescent lights provide a bright and continuous light source that allows the channel letters to be visible at night. These light sources, however, have a relatively short life (20,000 hours), are fragile, operate at high voltage (7,000 to 15,000 volts for neon) and can consume a relatively large amount of power. Neon bulbs can also experience difficulty with cold starting, which can lead to the bulb's failure.

LEDs are more frequently being used as the light source in different sign applications. U.S. Pat. No. 5,697,175, to Schwartz, discloses a low power illuminated sign that is particularly adapted for use with common EXIT signs over doorways. The back of each sign comprises a reflector with a series of cavities with curved surfaces. Each cavity corresponds to a letter and background area in the sign. LEDs are mounted in the center of the cavities to illuminate the letters or background area. The LEDs are provided on a separate perpendicular circuit board or on a central projection formed in the bottom of the cavities, with light from the LEDs directed outward. The letters and background area of the sign are illuminated by light reflecting forward from the curved surfaces of the cavities, so that the only visible light is from the illumination of the cavities.

U.S. Pat. No. 6,042,248, to Hannah et al., discloses an LED assembly for channel letter illuminating signs having an enclosure/housing covered by a translucent lens. Each sign includes a plurality of track moldings at the base of its enclosure, with the moldings running along the longitudinal axis of the sections of the channel letter. Linear arrays of LEDs are mounted on printed circuit boards (PCBs) that are then mounted in the track moldings. Each track molding can hold two PCBs in parallel with each of the PCBs arranged on a longitudinal edge, with the LEDs directed outward.

LED based channel letter lighting is also available from LumiLEDs, Inc., under part numbers HLCR-KR-R0100 and HLCR-KR99-R0200, which comprises LEDs that are each mounted by insulation displacement connectors (IDC) on two inch centers. The chain of LED modules is then mounted into a bendable clip or rail, each of which is then mounted inside a channel letter to hold the LEDs in place. Power is provided by a combination of an AC/DC mother power supply and a DC/DC daughter power supply. A sensing LED is also included as a temperature and current sensor.

U.S. Pat. Nos. 6,932,495 and 7,241,031, both to Sloan et al., disclose channel letter lighting units and lighting systems utilizing the lighting units. In some embodiments these lighting units can be provided as multiple lighting units interconnected by conductors in a chain so that an electrical signal applied to the chain causes the lighting units to emit light. The chain can be made available to purchasers on different holding devices such as a box, reel or rack. Different lengths of the chain can be utilized for a particular channel letter, with the desired length of chain being cut from the holding device and mounted within the channel letter. Power can then be applied to the chain in the channel letter causing the units to emit light.

Different types of chains can have different numbers of lighting units per a length, or stated differently, a different density of lighting units. These chains are typically sold at a cost per measure of length, and the cost per length is typically greater for lighting systems having higher density. To accommodate the different needs of customers for chains of different densities, many different types of lighting system chains need to be maintained and stored and made available to customers. In some channel letter applications it may be desirable to have different densities of units in different locations. This can require purchasing multiple chains with different densities for the same job.

Each of the lighting units in the chain also has a certain number of LEDs, such as two, four, eight, sixteen, etc., depending on the embodiment. In certain circumstances it may be desirable to have fewer than all the number of LEDs provided on the units, such as in locations where the illumination should be spread. Conventional lighting units, however, offer little flexibility in reducing the number of LEDs in certain ones or all of the LED units in a chain.

Lighting units have been constructed by either placing the LEDs within a molded plastic housing or encasing the entire lighting unit within a sealant without a separate housing. The LEDs are flat or parallel in relation to the lighting unit and facing upwards or directly away from the mounting surface of a lighting unit. This creates a light dispersion pattern which has a higher intensity in the center or over the lighting unit but lower intensity at the sides. Dispersion of the light from these lighting units within the channel letter is important to provide the appearance of even lighting throughout the entire channel letter. An even dispersion serves to provide the appearance that the channel letter is itself lighting up rather than having separate light sources within. Some lighting units incorporate the use of reflectors or a lens over these LEDs to help disperse the light, however these may cause a loss of light output due to the lens or reflector.

SUMMARY OF THE INVENTION

The present invention provides channel letter devices, systems and methods of manufacturing same. A lighting system, comprising a plurality of electrically connected lighting units, comprising conductors to provide an electrical signal to each of said units. Each of the lighting units comprise a housing, a printed circuit board (PCB) mounted within the housing and having a plurality of tabs and a plurality light emitting elements on the tabs. The tabs are angled in relation of the remainder of the PCB or housing. The electrical signal applied to said light emitting elements causes them to emit light substantially away from said housing. The lighting system further comprises a sealant within the housing filling cavities around the light emitting elements and the cavity around said PCB and a mounting mechanism for mounting said unit to a structure.

Other embodiments provide a lighting unit, comprising a housing, a printed circuit board (PCB) mounted within the housing and having a plurality of tabs and having a plurality of light emitting elements on the tabs. These tabs and light emitting elements are angled in relation to the remainder of the PCB or the housing. An electrical signal applied to the light emitting elements causes them to emit light substantially away from said housing. The lighting unit further comprises a sealant within the housing, filling the cavity around the PCB and cavities around the light emitting elements.

Some further embodiments provide channel letter lighting systems. These embodiments can comprise a channel letter housing, a translucent channel letter cover, and a plurality of electrically connected lighting units mounted to said channel letter housing. Conductors provide an electrical signal to each of said units. Each of the units comprises a lighting unit housing and a printed circuit board (PCB) mounted within the lighting unit housing and having a plurality of tabs and the tabs having a plurality of light emitting elements. The tabs and the plurality of light emitting elements are angled in relation to the remainder of the PCB or housing. An electrical signal applied to the light emitting elements causes them to emit light substantially away from the housing. Furthermore, a sealant fills the surrounding area of the PCB within the housing. The sealant also fills all other cavities or voids within said housing without covering said light emitting elements.

A better understanding of the features and advantages of the present embodiments will be obtained by reference to the following detailed description of the invention and accompanying drawings which set forth illustrative embodiments in which the principles of the invention are utilized.

BRIEF DESCRIPTION OF THE DRAWINGS

FIG. 1 is a perspective view of one embodiment of a LED lighting unit system according to the present invention;

FIG. 2 is a side view of the lighting unit shown in FIG. 1;

FIG. 6 is an exploded bottom view of one embodiment of a lighting unit in FIG. 1;

FIG. 9 is a bottom view of the lighting unit shown in FIG. 8;

DETAILED DESCRIPTION OF THE INVENTION

Figure 3:
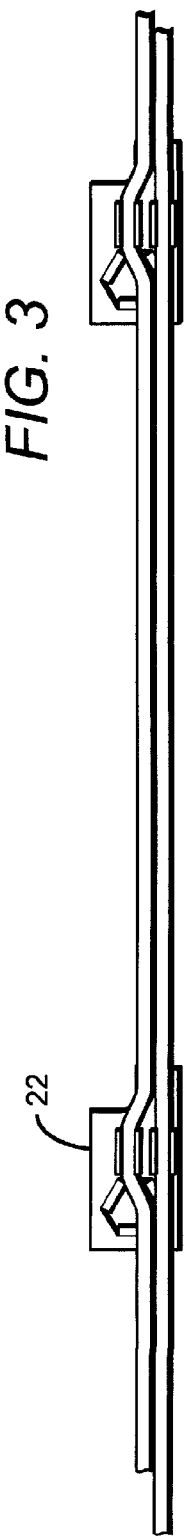
FIG. 3 is a bottom view of the lighting system shown in FIG. 1 with the housing and sealant removed.
Figure 4:
FIG. 4 is a side view of the lighting system shown in FIG. 1 with the housing and sealant removed

The present invention provides a lighting system that can be used in many different applications such as structural lighting, display lighting and ingress/egress lighting, but is particularly applicable to channel letter lighting. The systems according to the present invention provide lighting units that can be interconnected in a chain by electrical conductors so that an electrical signal applied to the input end of the conductors spreads to the lighting units, causing them to emit light. The lighting units can also be powered independently from other lighting units. According to the present invention, the LED units can be placed in a plastic housing. The side of the lighting unit which can be mounted on a surface will be referred to as the bottom 50 of the lighting unit (shown in FIG. 1). The surface opposite the bottom will be referred to as the top 52. The LEDs are placed in the housing in such a manner that they are on the top of the lighting unit, but angled away from the top surface such that they are no longer parallel to the top surface and can emit at least a portion of their light to the sides of the lighting unit. The plastic housing of the lighting unit is then filled with a sealant, which allows for the lighting units to be customized to meet the particular application. For example, in channel letter applications there may be instances where weatherproofing or additional ruggedness may be desired, and the present invention allows for the sealing or additional ruggedness to be altered, by the use of different housing or filler materials, meeting these different needs.

These embodiments not only allow for the sealing of units to protect them from contaminants, but also allow for both the ability to style the face of the units, since a molded housing is used for the face. Also the units have an added rigidity or ruggedness provided because both a housing and a sealant are utilized.

The present invention is described herein with reference to certain embodiments but it is understood that the invention can be embodied in many different forms and should not be construed as limited to the embodiments set forth herein. In particular, the invention is described with reference to certain embodiments where the lighting units or lighting unit sections are placed within a molded housing and filled with a sealant, but in other embodiments this process can be modified. In these embodiments, the PCB and lighting elements can be placed in the housing using different methods. In addition the lighting units may be filled and sealed using a variety of materials. The present invention can also be used with different types of lighting units used in different applications beyond channel letter lighting, and although the present invention is described herein with reference to light emitting diodes (LED or LEDs) other light sources can be used.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/ or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to illustrations that are schematic illustrations of embodiments of the invention. As such, the actual thickness of the layers and features can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a feature of a device and are not intended to limit the scope of the invention.

FIGS. 1 and 2 show one embodiment of a lighting system 10 according to the present invention that comprises a number of lighting units 12 daisy-chained together by first and second electrical conductors 14, 16. Each of the lighting units 12 has a number of light elements 18, 19, 20 (described below) that illuminate out from the unit 12 in response to an electrical signal. The lighting units may have any number of light elements 18, 19, 20 but 3 are shown in FIG. 1. The electrical conductors 14, 16 conduct electricity to the units 12 and an electrical signal applied to the conductors 14, 16 at one end of the lighting system 10 is conducted to each of the units 12 so that the light elements 18, 19, 20 on each of the units 12 simultaneously emit light. The units 12 are particularly adapted to being mounted in channel letters, each of which has a transparent or translucent cover. With a translucent cover, when the light elements 18, 19, 20 are illuminated in the channel letters, the light is diffused, by the features on the light elements or the translucent cover, to give the appearance that the channel letters have a continuous light source.

In the figures the same reference numbers will be used herein for the same or similar features with the understanding that the description above applies to this embodiment, as well as the embodiments described below.

Figure 5:
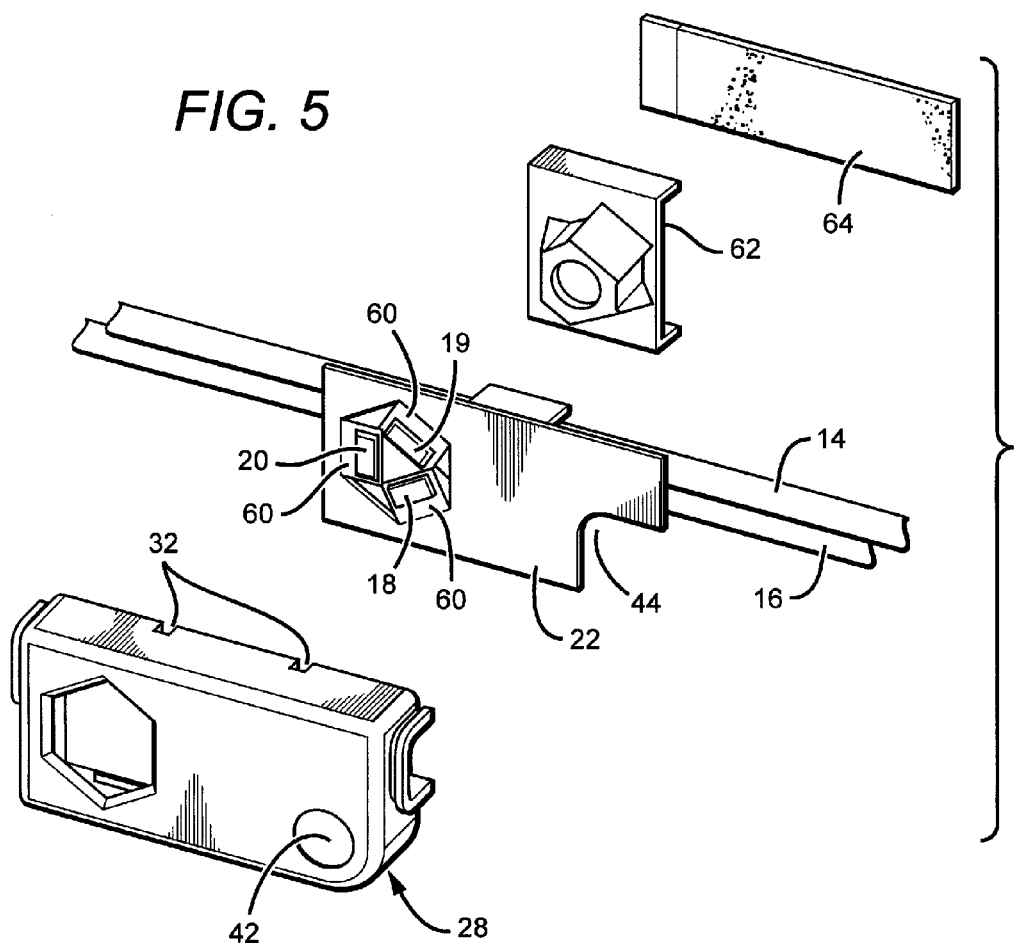
FIG. 5 is an exploded top view of one embodiment of a lighting unit in FIG. 1.

FIGS. 3 through 9 show the lighting system 10 in FIGS. 1 through 2 in more detail, with the lighting units and conductors 14, 16 shown from different angles. Each of the units comprises a printed circuit board (PCB) 22 mounted within a lighting unit housing 24. This PCB can be made of flexible material, rigid material, or any other suitable PCB material. In embodiments where the PCB is made of a flexible material, the LEDs or lighting elements 18, 19, 20 would be on flaps or tabs 60 of the PCB 22. In embodiments where the PCB 22 is made of a rigid material, additional wiring may be required from the tabs to the remainder of the PCB 22. Also, in embodiments where the PCB 22 is made of a rigid material, the tabs are arranged such that they may be bent to accommodate the angled shaped plate or insert 62 (also called a housing plate). The tabs 60 may also be separate portions connected by suitable connection methods and wiring or soldering. As shown in FIG. 5, the housing comprises a top housing portion 28 that the PCB 22 can be mounted into. The top housing portion 28 can be made of many conductive, semi-conductive and non-conductive materials, with a preferred material being plastic and can be made using many known processes such as by extrusion or injection molding. The housing also comprises a shaped plate 62. The plate 62 is inserted in the top housing portion after the PCB 22 and it functions to force the tabs 60 of the PCB up and through the opening in the top housing portion 28. The tabs 60 and lighting elements 18, 19, 20 are then positioned outside the top of the top housing portion 28 and supported by plate 62.

The PCB 22 has first, second and third lighting elements 18, 19 and 20 (shown in FIGS. 3, 4, 5) mounted to one side on the tabs 60, and conductors 14, 16 are mounted or connected to the PCB. Many different connection methods can be used, with one suitable method being soldering or with the use of IDC connectors or IPC connectors (Insulation Piercing Connectors). The conductors 14, 16 are shown to be mounted to the opposite side of the PCB 22 as lighting elements 18, 19, 20, but can be mounted and connected on either side of the PCB. The conductors 14, 16 electrically couple the signal on the conductors 14, 16 to their respective one of the units 12. The PCB 22 also comprises conductive traces (not shown) to conduct electrical signals from the conductors 14, 16 to the lighting elements 18, 19, 20 so that an electrical signal applied to the first and second conductors 14, 16 is conducted to the lighting elements 18, 19, 20 through the traces, causing the elements to emit light.

The elements 18, 19, 20 are generally mounted such that the center of the group of light elements 18, 19, 20 is along the longitudinal axis of the PCB 22, although they can also be mounted in other locations. In other embodiments the lighting units can comprise more or less than three lighting elements, such as four, six, and eight or more, that can be mounted in many different locations. The light elements 18, 19, 20 can be any device that emits light in response to an electrical signal, such as incandescent lights, lasers, laser diodes, fluorescent light or neon lights, with the preferred light elements 18, 19, 20 being light emitting diodes (LEDs). The elements 18, 19, 20 can emit different colors of different intensities, with a suitable LED comprising commercially available LEDs. One suitable LED would output 150 lumens per watt. In some embodiments, light elements may not have a lens, have lenses built in, or they may be added later.

The PCB 22 can be any conventional type made from any conventional material, with a preferred PCB 22 being a flexible type PCB. Different types of flexible boards can be used such as a board comprised of alternating layers of polyimide film and copper. By being a flexible material, tabs 60 may remain connected to the PCB 22 while capable of flexing in the direction plate 62 forces the tabs 60. Heat from the light elements conducts into the PCB 22 so that the PCB 22 helps draw away heat from the light elements 18, 19, 20. The PCB 22 then provides a larger surface area that allows the heat to dissipate into the surrounding ambient. This can help keep the light elements 18, 19, 20 cooler, which can allow them to operate under a higher current so that they can emit a higher luminous flux. Also, the light elements 18, 19, 20 may last longer if operating at a cooler temperature. In a PCB constructed of alternating layers of polyimide film and copper, the copper layers would allow for heat dissipation. Thermal vias, which connect the copper planes together, may be added around the light elements 18, 19, 20 to allow for better, more efficient heat transfer.

Figure 7:
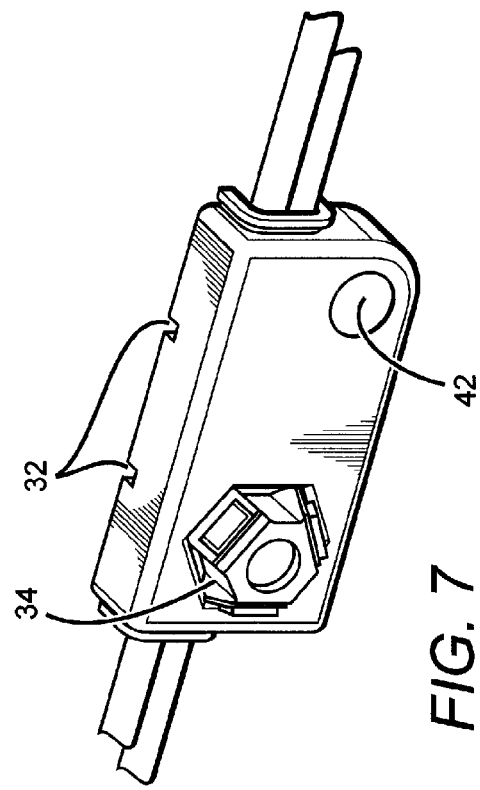
FIG. 7 is a perspective view of another embodiment of a lighting unit according to the present invention before the sealant is applied.
Figure 8:
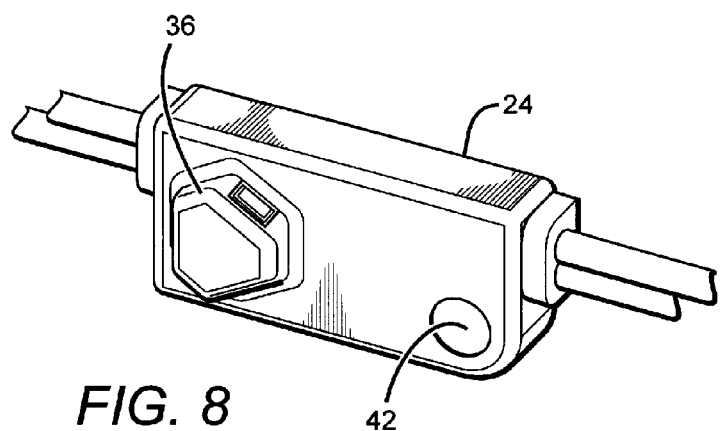
FIG. 8 is a perspective view of an embodiment of a lighting unit according to the present invention after the sealant is applied.

As shown in FIG. 8, the light elements 18, 19, 20 are angled so they do not face straight up from the top of the lighting unit. This angling is accomplished by housing plate 62 forcing the tabs on the PCB 22 out of the top housing portion 28 and holding these tabs at a desired angle, shown in FIGS. 5, 6, and 7. A thermal hotmelt or sealant is later added to keep these tabs in place (described below). The light elements are angled and arranged to disperse light evenly in a channel letter lighting unit. Channel letter lighting units have a variety of depths but they largely fall into the 2-5 inch range. Channel letter lighting units which will use LED lighting have a target depth of 2 inches.

The light elements in the present application are angled and positioned such that their light emissions overlap over the top of the lighting unit to create an even light dispersion. The light elements are angled by angling tabs 60 and tabs 60 are angled by the shaped plate 62. The angle of the tabs 60 directly impact the angle of the light elements. The light elements generally have a higher output at the center of the light element, but lower output to the sides of each light element. When the light elements are angled, the center and highest intensity output of each light element is angled off center from the lighting unit itself. This direction of light output travels the furthest distance to the surface of the channel letter lighting unit to illuminate the channel letter lighting unit. Therefore providing a higher intensity output at these angles can provide more even light dispersion. The light dispersed directly over the lighting unit 12, is light dispersed at an angle for each of the light elements 18, 19, 20, and at a lower intensity. Light emitted directly over the lighting unit travels the shortest distance to illuminate the channel letter lighting unit and therefore does not need to be as intense as light traveling to areas not directly over the lighting unit 12. Further, to accommodate for the lower intensity of light being emitting from the light elements 18, 19, 20 in this direction, the light outputs of the angled light elements 18, 19, 20 are overlapped in this area to create an even light dispersion.

In one embodiment using three light elements, the light elements would be angled at 60-75 degrees to provide this even light dispersion. In another embodiment, the light elements would be angles at 45-85 degrees. In yet other embodiments other angle placements of the lighting elements may be used. Preferably, the light elements will not be placed at either 0 degree or 90 degree angles. The lighting unit 12 may have any number of light elements and the number of light elements and their distance from one another determines the preferred angles the light elements should face for optimal channel letter lighting. For example if the light elements are further apart, a more decreased angle is desired. However, if the light elements are closer together a steeper angle would be desired. Furthermore, an additional, possibly weaker or brighter, light element may be placed on the surface between the other lighting elements, on top of the dome created by housing plate 62, to aid in the creation of an even light dispersion. Additionally, the light elements may include optics or lenses over said light elements.

Lighting units according to the present invention can also comprise other elements, with one embodiment comprising heat sinks to dissipate heat from the light elements. Another embodiment may comprise constant current devices (not shown) that can be mounted on the PCB using conventional methods. This allows each of the units to have substantially the same current driving its light elements 18, 19, 20 so that each of the units 12 emits substantially the same amount of light. The light elements 18, 19, 20, and constant current device can be interconnected by conductive traces on the PCB using conventional methods. Without a constant current device, the system 10 can experience light loss as the power signal passes down the conductors 14, 16 through each of the units 12. This can ultimately result in a channel letter exhibiting different brightness across its cover or by different channel letters in a sign having different brightness. By driving each of the light elements 18, 19, 20 in each of the units 12 with the same current, the light elements along the conductor will have the same brightness. Many different constant current devices 30 can be used, with a suitable device being an LM317M 3-Terminal Adjustable Regulator provided by Texas Instruments, National Semiconductor, and Fairchild Semiconductor.

In one embodiment, a PCB 22 with lighting elements 18, 19, 20 and electrically connected conductors 14, 16 can be snapped into place inside a top housing portion 28 (as shown in FIGS. 5, 6 and 7), followed by housing plate 62. Next the cavities 34 left within the top housing portion around the plate 62, light emitters 18, 19, 20 and the PCB 22 are filled with a sealant, which bonds to the housing 28, PCB, and any other component the sealant contacts within the cavity (shown in FIG. 8). The sealant may be filled into the cavities from the side ports 32 of the top housing portion 28 and then allowed to cure fully. It must be ensured that there are no voids or air cavities and no sealant material is deposited on the light emitter or light emitter lenses. In order to cover the areas of the PCB 22 which are exposed outside of the top housing portion 28, around lighting elements 18, 19, 20, during application of the sealant the lighting unit is placed within a mold. This mold has a cavity the shape of the desired dome or area around the lighting elements 18, 19, 20. The mold also has posts inside which press against the lighting elements 18, 19, 20 to prevent the sealant from flowing over the lighting elements 18, 19, 20 or associated lenses over these lighting elements. Covering this area of PCB 22 around the lighting elements 18, 19, 20 is also important to provide stability and rigidity for the placement of the lighting elements 18, 19, 20. FIG. 7 shows the lighting unit before the sealant is added and FIG. 8 shows the lighting unit after the sealant 36 has been added. In some embodiments, this sealant may be a thermoplastic hotmelt which allows for sealing of the lighting unit from contaminants. For example, an embodiment of this lighting unit using a thermoplastic hotmelt as a filler and sealant could receive a large range of ingress protection ratings such as IP00 to IP68 or any other available rating. Some embodiments may have ingress protection ratings which are IP61 to IP68. Other embodiments may have a rating of IP68. When reading ingress protection ratings, the first digit indicates the level of protection that the enclosure provides against access to hazardous parts and the ingress of solid foreign objects. The second digit indicated the level of protection of the equipment inside the enclosure against harmful ingress of water. Generally the higher the number the better the protection. One suitable thermoplastic hotmelt is Macromelt© manufactured by Henkel AG & Co.

Bonding of the sealant 36 to components within the top housing portion 28 and filling of the cavities 34, also reduces strain on connections within the lighting unit such as strain on the emitter 18, 19, 20 connections and conductors 14, 16. The reduction of strain is a result of the sealant hardening around the components thereby reducing movement and supporting those connections.

In conventional lighting units utilizing only a plastic housing provides rigidity but not a weatherproof seal. In conventional lighting units utilizing only a sealant or thermoplastic hotmelt provides weatherproofing but does not produce as a rigid of a product and the product face cannot be styled as that of one with a plastic housing. Utilizing both a top housing portion 28 and a sealant 36 such as macromelt can provide additional rigidity, weatherproofing, and a product face which can be stylized. This provides a product robust for installation and with a finished appearance.

Each lighting unit 12 can be mounted within a channel letter by many different methods such as by glue, clamp, bolt, weld, etc. Lighting unit 12 can be provided with double sided tape on its bottom surface 50 for mounting, as shown in FIG. 9. Many different double sided tapes 64 can be used, with a preferred tape being a commercially available double sided foam tape provided by 3M Corporation. The lighting unit 12 can also be provided with an alternative mounting method that can be used alone or in conjunction with the double sided tape. The top housing portion 28 includes a housing mounting hole 42 through which a screw, nail or rivet can pass to mount the housing 24 (shown in FIG. 8). The PCB 22 also comprises a PCB mounting hole 44 in alignment with the housing mounting hole 42. Sealant 36 is applied in a manner, such as by blocking the area from sealant or any other suitable manner, which does not fill mounting hole 42 so that mounting hole 42 extends through the lighting unit. In one embodiment according to the present invention a screw can pass through the PCB mounting hole 44 and into the top housing portion mounting hole 42. A screwdriver can then pass through the PCB mounting hole 44 to turn the screw into the channel letter, through the top housing portion 28 mounting hole 42.

Lighting systems according to the present invention can be arranged in many different ways to allow for reducing the density of lighting units or lighting elements in a chain of lighting units. In the embodiments described above, the density can be decreased by increasing the length of conductor between different ones of the lighting units.

Although the present invention has been described in considerable detail with reference to certain preferred configurations thereof, other versions are possible. Lighting units according to the invention can be used for many different applications beyond channel letters. A separate power supply can be used for each channel letter or multiple letters can be powered by a single power supply. In other embodiments, a variable power supply can be used to control the intensity of the light emitters. The lighting unit can be many different sizes and can be used in many different applications beyond channel letters. The PCB can have different numbers of LEDs and can have different electronic components arranged in different ways. The conductors can be different lengths and instead of running uninterrupted between the units, the conductors can have connectors. This would allow the units to be supplied separately and then connected together when installed. Therefore, the spirit and scope of the invention and should not be limited to the preferred versions described above.

We claim:

1. A lighting system, comprising:
   a plurality of electrically connected lighting units, comprising conductors to provide an electrical signal to each of said units, each of which comprises:
   a housing;
   a printed circuit board (PCB) mounted within said housing and having a plurality of tabs, a plurality light emitting elements on said tabs, said tabs angled in relation of the remainder of the PCB, the electrical signal applied to said light emitting elements causing them to emit light substantially away from said housing;
   further comprising a material within said housing surrounding said light emitting elements and said PCB, wherein said material adheres to said housing and said PCB and said material does not substantially cover said light emitting elements; and
   a mounting mechanism for mounting said unit to a structure.

2. The system of claim 1, wherein at least one said PCB in said lighting system comprises a metal core PCB arranged to conduct heat away from said light emitting elements.

3. The system of claim 1, wherein said PCB in said lighting system comprises alternating layers of polyimide film and copper.

4. The system of claim 3, wherein said PCB further comprises vias arranged in proximity to said light emitting elements for heat dissipation.

5. The system of claim 1, wherein said PCB is capable of conducting and dissipating heat from said light emitting elements.

6. The system of claim 1, wherein at least one of said light emitting elements comprises a light emitting diode.

7. The system of claim 1, wherein at least one of said light emitting elements comprises a high luminous flux light emitting diode emitting white light.

8. The system of claim 1, wherein each of said units further comprises a constant current device, each of which accepts said electrical signal and provides substantially the same current to the light emitting elements on its respective one of said units.

9. The system of claim 1, wherein said conductors comprise two conductors, each of said units electrically connected to said conductors.

10. The system of claim 9, wherein said units electrically connect to said conductors by soldering.

11. The system of claim 9, wherein said units electrically connect to said conductors by IDC connectors.

12. The system of claim 1, wherein said housing only partially encloses each of said units.

13. The system of claim 1, wherein said housing comprises a top portion and an inner housing plate.

14. The system of claim 1, wherein said inner housing plate protrudes out of said top portion forcing said tabs to be angled in relation to said PCB.

15. The system of claim 12, wherein said material completes the enclosure of said units not completed by said housing, filling the cavities around said light emitting elements and the cavity around said PCB.

16. The system of claim 1, wherein said tabs and said light emitting elements are arranged such that light output from each of said light emitting elements over said lighting units is at least partially overlapping.

17. The system of claim 1, wherein said light emitting elements do not all face the same directions.

18. The system of claim 1, wherein said light emitting elements and said tabs are angled 1 degree to 89 degrees in relation to the remainder of the PCB.

19. The system of claim 1, wherein said light emitting elements and said tabs are angled 60 degrees to 75 degrees in relation to the remainder of the PCB.

20. The system of claim 1, comprising drive electronics for said light emitting elements on each of said unit's PCB.

21. The system of claim 1, wherein said mounting mechanism in at least one of said units comprises double sided tape.

22. The system of claim 1, wherein said housing in at least one of said units comprises a mounting hole extending through said material and wherein said mounting mechanism comprises a screw to cooperate with said mounting hole.

23. The system of claim 1, wherein said housing in at least one of said units comprises a mounting hole extending through said material and a screw boss, and wherein said PCB comprises a PCB hole, said boss aligned with said mounting hole and said PCB hole and extending between said housing and said PCB.

24. The system of claim 1, wherein said housing in at least one of said units comprises a mounting hole, and wherein said PCB comprises a PCB hole, said mounting hole and said PCB hole aligned, and extending through said material.

25. A lighting unit, comprising:
a housing;
a printed circuit board (PCB) mounted within said housing and having a plurality of tabs and having a plurality of light emitting elements on said tabs, said tabs and light emitting elements angled in relation to the remainder of said PCB, an electrical signal applied to said light emitting elements causing them to emit light substantially away from said housing; and
a sealant within said housing, filling the cavity around said PCB and cavities around said light emitting elements.

26. The lighting unit of claim 25, wherein said PCB has a conductive core conducting heat from said light emitting elements.

27. The lighting unit of claim 25, further comprising a constant current device mounted on said PCB, accepting an electrical signal and providing a constant current to said light emitting elements.

28. The lighting unit of claim 25, further comprising a mounting mechanism for mounting said unit to a structure.

29. The lighting unit of claim 25, wherein said housing comprises a top portion and an inner housing plate.

30. The lighting unit of claim 29, wherein said inner housing plate protrudes from said top portion forcing said tab and said light emitting elements out of said top portion at an angle in relation to said top portion.

31. The lighting unit of claim 25, wherein each of said light emitting elements do not face the same direction.

32. The lighting unit of claim 25, wherein each of said tabs and each of said light emitting elements are angled 1-89 degrees in relation to said housing.

33. The lighting unit of claim 25, wherein each of said tabs and each of said light emitting elements are angled 60-75 degrees in relation to said housing.

34. The lighting unit of claim 25, wherein said tabs and said light emitting elements are arranged such that light output from each of said light emitting elements over said lighting units is at least partially overlapping.

35. The lighting unit of claim 25, wherein said light emitted by each of said light emitting elements directly over said lighting unit is of a lower intensity than light emitted by each of said light emitting elements at an angle in relation to said lighting unit.

36. The unit of claim 25, wherein said housing only partially encloses said unit.

37. The unit of claim 36, wherein said PCB is mounted to said housing with a space between most of said housing and the bottom and top surface of said PCB to allow said sealant to fill into the surrounding area around said PCB, enclosing said unit.

38. The unit of claim 25, further comprising drive electronics mounted to said PCB.

39. The unit of claim 25, wherein said sealant bonds to said housing and said PCB, strengthening connections between components therein.

40. The unit of claim 25, wherein said sealant is a thermoplastic hotmelt.

41. The unit of claim 25, wherein said PCB in said lighting unit comprises alternating layers of polyimide film and copper.

42. The unit of claim 41, wherein said PCB further comprises vias arranged in proximity to said light emitting elements for heat dissipation.

43. A channel letter lighting system, comprising:
a channel letter housing;
a translucent channel letter cover;
a plurality of electrically connected lighting units mounted to said channel letter housing;
conductors to provide an electrical signal to each of said units, wherein each of said units comprises:
a lighting unit housing;
a printed circuit board (PCB) mounted within said lighting unit housing and having a plurality of tabs and said tabs having a plurality of light emitting elements, said tabs and said plurality of light emitting elements angled in relation to the remainder of said PCB, said electrical signal applied to said light emitting elements, causing them to emit light substantially away from said housing; and
a sealant filling the surrounding area of said PCB within said housing, said sealant also filling all other cavities or voids within said housing without covering said light emitting elements.

44. The system of claim 43, wherein said PCB has a conductive core conducting heat from said light emitting elements.

45. The system of claim 43, wherein said PCB in said lighting system comprises alternating layers of polyimide film and copper.

46. The unit of claim 45, wherein said PCB further comprises vias arranged in proximity to said light emitting elements for heat dissipation.

47. The unit of claim 43, further comprising a space between most of bottom and top surface of said PCB and said lighting unit housing.

48. The system of claim 43, further comprising a constant current device mounted on said PCB, accepting an electrical signal and providing a constant current to said light emitting elements.

49. The system of claim 43, further comprising a mounting mechanism for mounting said unit to said channel letter structure.

50. The system of claim 43, wherein said housing comprises a top portion and an inner housing plate.

51. The lighting unit of claim 50, wherein said inner housing plate protrudes from said top portion forcing said tabs and said light emitting elements out of said top portion at an angle in relation to said top portion.

52. The system of claim 43, wherein each of said light emitting elements do not face the same direction.

53. The system of claim 43, wherein each of said tabs and each of said light emitting elements are angled 1-89 degrees in relation to said housing.

54. The system of claim 43, wherein each of said tabs and each of said light emitting elements are angled 60-75 degrees in relation to said housing.

55. The system of claim 43, wherein said tabs and said light emitting elements are arranged such that light output from each of said light emitting elements over said lighting units is at least partially overlapping.

56. The system of claim 43, wherein said light emitted by each of said light emitting elements directly over said lighting unit is of a lower intensity than light emitted by each of said light emitting elements at an angle in relation to said lighting unit.

57. The system of claim 43, wherein said light emitted from said light emitting elements is at a lower intensity in the direction which is the shortest distance from the light emitting unit to said translucent channel letter cover and said light emitted from said light emitting elements is at a higher intensity in the direction which is the longest distance to said translucent channel letter cover.

58. The system of claim 43, wherein at least one said PCB in said lighting units comprises a metal core PCB arranged to conduct heat away from said light emitting elements.

59. The system of claim 43, wherein at least one of said light emitting elements comprises light emitting diode.

60. The system of claim 43, wherein each of said units further comprises a constant current device, each of which provides substantially the same current to said light emitting elements on its respective one of said units.

61. The system of claim 43, comprising drive electronics for said light emitting elements on each of said unit's PCB.

62. The system of claim 49, wherein said mounting mechanism in at least one of said units comprises double sided tape.

63. The system of claim 49, wherein said housing in at least one of said units comprises a hole, said PCB also comprising a hole, said hole extending through said sealant, and wherein said mounting mechanism comprises a screw to cooperate with said hole.

64. The system of claim 43, wherein said translucent cover disperses light from said lighting units giving that the appearance that said channel letter is illuminated by a continuous light source.

65. A method for fabricating a lighting unit, comprising:
providing a housing with an opening;
providing a printed circuit board (PCB) having a plurality of tabs and having a plurality of light emitting elements on said tabs;
mounting said PCB within said housing;
providing a shaped plate;
angling said tabs and light emitting elements angled in relation to the remainder of said PCB by inserting said shaped plate into said housing such that said shaped plate pushes at least a portion of said tabs and light emitting elements out of the opening of said housing; and
providing a sealant within said housing by filling the cavity around said PCB, shaped plate, and cavities around said light emitting elements.

66. The method of claim 65 wherein said tabs and light emitting elements are angled in relation to the remainder of said PCB such that said light emitting elements emit light at an angle in relation to said housing.

67. The method of claim 65 further comprising applying an electrical signal to said light emitting elements causing them to emit light substantially away from said housing.

68. The method of claim 65 wherein said sealant does not substantially cover said light emitting elements.

69. The method of claim 65 wherein said PCB has a conductive core conducting heat from said light emitting elements.

70. The method of claim 65 further comprising:
providing a constant current device;
mounting said constant current device on said PCB; and
accepting an electrical signal and providing a constant current to said light emitting elements.

71. The method of claim 65 further comprising providing a mounting mechanism for mounting said unit to a structure.

72. The method of claim 65 wherein each of said light emitting elements do not face the same direction.

73. The method of claim 65 wherein each of said tabs and each of said light emitting elements are angled 1-89 degrees in relation to said housing.

74. The method of claim 65 wherein each of said tabs and each of said light emitting elements are angled 60-75 degrees in relation to said housing.

75. The method of claim 67 further comprising arranging said tabs and said light emitting elements such that light output from each of said light emitting elements over said lighting units is at least partially overlapping.

76. The method of claim 67 wherein said light emitted by each of said light emitting elements directly over said lighting unit is of a lower intensity than light emitted by each of said light emitting elements at an angle in relation to said lighting unit.

77. The method of claim 65 wherein said PCB is mounted such that there is a space between most of said housing and the bottom and top surface of said PCB to allow said sealant to fill into the surrounding area around said PCB, enclosing said unit.

78. The method of claim 65 further comprising mounting drive electronics to said PCB.

79. The method of claim 65 wherein said sealant bonds to said housing and said PCB, strengthening connections between components therein.

80. The method of claim 65 wherein said sealant is a thermoplastic hotmelt.

81. The method of claim 65 wherein said PCB in said lighting unit comprises alternating layers of polyimide film and copper.

82. The method of claim 65 further comprising providing vias on said PCB arranged in proximity to said light emitting elements for heat dissipation.

* * * * *